United States Patent (10) Patent No.: US 7,608,865 B1
Namba et al.                                    (45) Date of Patent:        Oct. 27, 2009

(54) CLUB EXTENSION TO A T-GATE HIGH ELECTRON MOBILITY TRANSISTOR

(75) Inventors: Carol Osaka Namba, Walnut, CA (US); Po-Hsin Liu, Anaheim, CA (US); Ioulia Smorchkova, Lakewood, CA (US); Michael Wojtowicz, Long Beach, CA (US); Robert Coffie, Camarillo, CA (US); Yaochung Chen, Rancho Palos Verdes, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 0 days.

(21) Appl. No.: 12/150,417

(22) Filed: Apr. 28, 2008

(51) Int. Cl.
*H01L 31/092* (2006.01)
*H01L 31/109* (2006.01)
*H01L 31/0328* (2006.01)
*H01L 31/0336* (2006.01)

(52) U.S. Cl. .................. 257/194; 257/200; 257/288; 257/E21.085; 257/E21.126; 257/E21.129; 257/E21.134

(58) Field of Classification Search .......... 257/194, 257/200, 201, 346, 288, 614, 615, 745
See application file for complete search history.

(56) References Cited

U.S. PATENT DOCUMENTS

| 5,385,851 | A  | * | 1/1995  | Misawa et al.   | 438/571 |
| 6,387,783 | B1 | * | 5/2002  | Furukawa et al. | 438/574 |
| 6,489,639 | B1 | * | 12/2002 | Hoke et al.     | 257/194 |
| 7,413,942 | B2 | * | 8/2008  | Pellens et al   | 438/182 |
| 7,465,527 | B2 | * | 12/2008 | Kon et al.      | 430/270.1 |
| 7,465,967 | B2 | * | 12/2008 | Smith et al.    | 257/194 |
| 7,468,295 | B2 | * | 12/2008 | Shim et al.     | 438/182 |

* cited by examiner

*Primary Examiner*—David Nhu
(74) *Attorney, Agent, or Firm*—Carmen Patti Law Group, LLC

(57) ABSTRACT

A method of fabricating a T-gate HEMT with a club extension comprising the steps of: providing a substrate; providing a bi-layer resist on the substrate; exposing an area of the bi-layer resist to electron beam lithography where the area corresponds to a T-gate opening; exposing an area of the bi-layer resist to electron beam lithography where the area corresponds to the shape of the club extension wherein the area corresponding to the club extension is approximately 1 micron to an ohmic source side of a T-gate and approximately 0.5 microns forward from a front of the T-gate; developing out the bi-layer resist in the exposed area that corresponds to the T-gate opening; developing out the bi-layer resist in the exposed area that corresponds to the club extension; and forming the T-gate and club extension through a metallization process.

12 Claims, 7 Drawing Sheets

CLUB EXTENSION TO A T-GATE HIGH ELECTRON MOBILITY TRANSISTOR

TECHNICAL FIELD

The invention relates generally to a T-gate High Electron Mobility Transistor and, more particularly, to a club extension to a T-gate High Electron Mobility Transistor.

BACKGROUND

As demands on wireless and other electronic devices evolve there is an increased need for electronic devices that can provide higher performance at high frequency. One way of meeting these requirements is to create devices using T-gates. The T-gate is a gate conductor structure for a semiconductor device, such as a Gallium Nitride High Electron Mobility Transistor (GaN HEMT). For high performance such as a high operating frequency and a high transconductance, the stem of the T-gate is narrow. For high switching speeds the wings (or top) of the T-gate are wide. The result is a gate conductor structure that provides the high performance and high frequency demanded in electronic devices such as high performance commercial communications and military systems.

The demand for higher performance conductor structures leads to a more demanding semiconductor fabrication process. Particularly in the area of fabricating T-gates using bi-layer resists, there cannot be any spurious material extending from a T-gate to a source or drain ohmic contact. Electron beam exposure and development may cause stress cracks in a bi-layer resist. Fabricating a T-gate using a cracked resist may lead to spurious material extending from these cracks. Such spurious material may cause the T-gate to short to an ohmic contact. Even if the spurious material does not cause the T-gate to short, the spurious material may cause electrical breakdown of HEMT devices.

Therefore, there is a need in the art for an improved method and system for fabricating T-gates such that electron beam exposure and development does not cause stress cracks in a resist, and spurious material does not extend from a T-gate to a source or drain ohmic contact.

SUMMARY

One embodiment of a method and system is a method of fabricating a T-gate HEMT with a club extension comprising the steps of: providing a substrate; providing a bi-layer resist on the substrate; exposing an area of the bi-layer resist to electron beam lithography where the area corresponds to a T-gate opening; exposing an area of the bi-layer resist to electron beam lithography where the area corresponds to the shape of the club extension wherein the area corresponding to the club extension is approximately 1 micron to an ohmic source side of a T-gate and approximately 0.03 to 0.5 microns forward from a front of the T-gate; developing out the bi-layer resist in the exposed area that corresponds to the T-gate opening; developing out the bi-layer resist in the exposed area that corresponds to the club extension; and forming the T-gate and club extension through a metallization process.

Another embodiment of the method and system encompasses a system. The system may comprise: a T-gate HEMT; a club extension positioned on an ohmic source side of a proximate front of the T-gate and approximately 0.03 to 0.5 microns forward from a front of the T-gate; and wherein the club extension is metallically affixed to the T-gate and the T-gate is affixed to a substrate.

DESCRIPTION OF THE DRAWINGS

The features of the embodiments of the present method and apparatus are set forth with particularity in the appended claims. These embodiments may best be understood by reference to the following description taken in conjunction with the accompanying drawings, in the several figures of which like reference numerals identify like elements, and in which:

DETAILED DESCRIPTION

Embodiments of the present method and system fabricate a T-gate HEMT without spurious metal extending from the T-gate to an ohmic contact.

T-gates are typically formed on a substrate that is covered with a resist. The resist may be a bi-layer resist. Electron Beam Lithography (EBL) is a technique used to form fine patterns used in integrated circuits. The patterns are typically formed in the resist. The resist may be an electron sensitive polymer that forms a coating on the substrate. The resist is exposed to an electron beam and the resist is chemically treated to form a pattern in the resist. The pattern formed may comprise an area where a T-gate and club extension is ultimately created. Resting on the substrate may be ohmic contacts. Ohmic contacts serve the purpose of carrying electrical current into and out of the semiconductor.

Figure 1A:
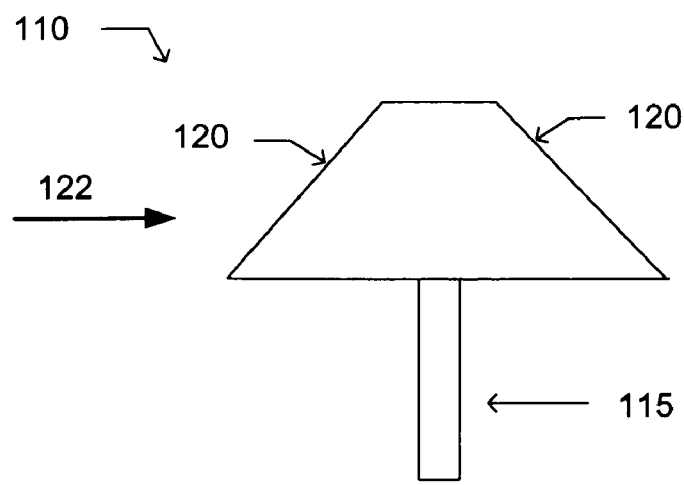
FIG. 1a is a front view of a T-gate.

Turning to FIG. 1, a typical T-gate 110 is shown. As shown in FIG. 1a, the T-gate 110 may have a stem 115 and wings 120. The wings 120 of the T-gate 110 may be wider than the stem 115 of the T-gate 110. A part of the T-gate that sits above the stem may be considered a top of the T-gate. Although in FIG. 1a the T-gate 110 is shown with a top that comes to an approximate apex, the top of the T-gate 110 may form an apex, or the top of the T-gate 110 may form an irregular shape.

Figure 1B:
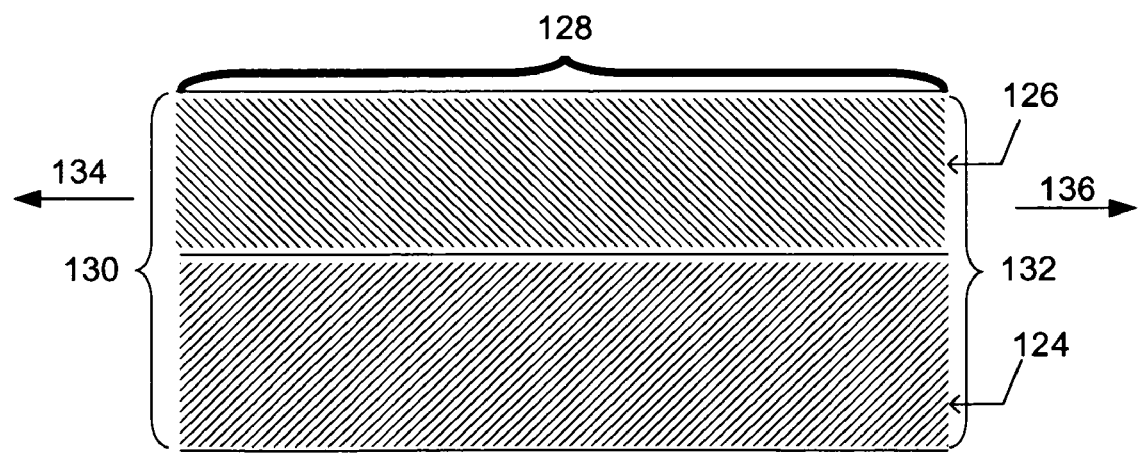
FIG. 1b is a side view of the T-gate.

Herein, a "front" view of the T-gate 110 provides the viewer with the widest view of the wings 120 of the T-gate 110. Thus the view of the T-gate 110 as seen in FIG. 1a is a front view. FIG. 1b illustrates a side-view 122 of FIG. 1a. As seen from a side 122, the T-gate 110 may appear as two rectangles 124, 126 stacked on top of each other. A lower rectangle 124 may be a side-view 122 of the stem 115 of the T-gate 110. An upper rectangle 126 may be a view of the wing 120 of the T-gate 110. The T-gate 110 may also have a length 128.

The T-gate 110 may have a first end 130 and a second end 132. Either end 130, 132 of the T-gate 110 may be referred to as a front or a back. For example, the first end 130 may be referred to as a front end 130 of the T-gate 110, and the second end 132 may be referred to as the back end 132 of the T-gate. It is equally true that the second end 132 may be referred to as a front end 132, and the first end 130 may be referred to as a back end 132. Each end 130, 132 may have a position that is forward from that end 130, 132. The forward position from a front end may a direction that is perpendicularly away from the end 130, 132 of the T-gate 110. Thus, if the first end 130 were a front end, the forward 134 direction would be perpendicularly away from the first end 130. On the other hand, if the second end 132 were a front end, the forward 136 direction would be perpendicularly away from the second end 132.

Figure 2:
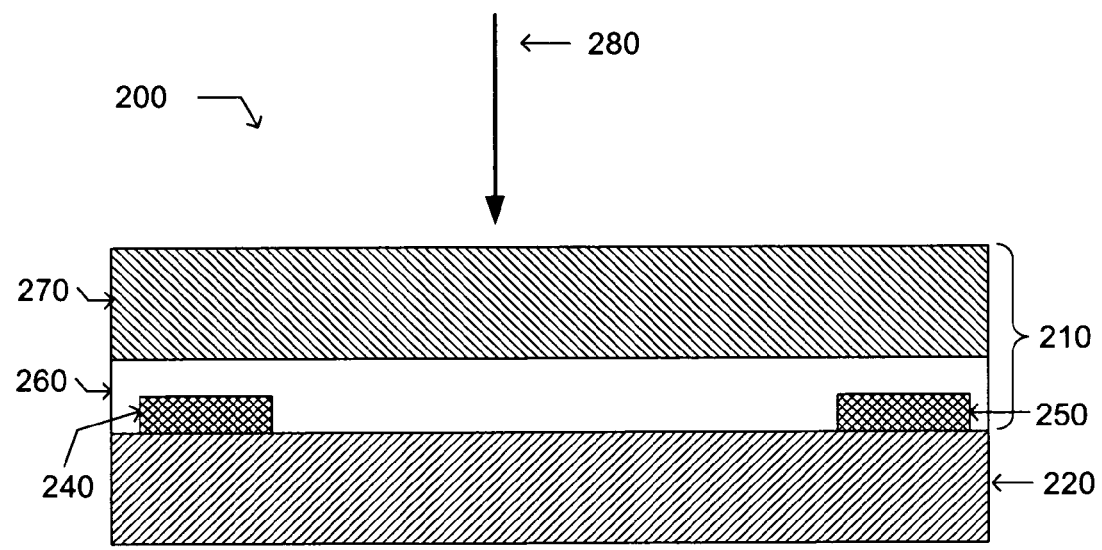
FIG. 2 is a front view of a bi-layer resist on a substrate.

Turning to FIG. 2 that depicts a structure 200 that may be used to form the T-gate 110. The structure 200 may consist of a bi-layer resist 210 resting on a substrate 220. Resting on the substrate 220 may be ohmic contacts 240, 250. As seen in FIG. 2 a left side ohmic contact 240 may be a source ohmic contact. A right side ohmic contact 250 may be drain ohmic contact. Among other materials, the substrate 220 may be comprised of Gallium Nitride (GaN), Silicon Carbide (SiC), SiN, Sapphire, or any III V substrate. The bi-layer resist 210 may be comprised of two layers of materials. A bottom layer 260 of the resist 210 may be comprised of a polymethyl methacrylate (PMMA). A top layer 270 of the resist 210 may be a copolymer of methacrylic acid and methyl methacrylate.

The top of the resist 210 may be exposed to an electron beam 280. This is the electron beam lithography (EBL) process. The electron beam 280 may form a pattern in the resist 210. The pattern in the resist 210 may correspond to an opening where the T-gate 110 may reside. Thus the pattern may approximate a rectangle. Another pattern in the resist 210 may also correspond to a club extension. The T-gate 110 and club extension patterns may be formed using two or more passes of the electron beam 280 or by using one pass of the electron beam 280.

FIG. 3 is an overhead view of the structure illustrated in FIG. 2. FIG. 3 illustrates an area of the resist 210 that may be exposed to the electron beam 280 to form an opening that may contain the T-gate 110 and an opening that may contain a club extension. FIG. 3 is broken down into four separate figures. In each figure, a large rectangle 300 illustrates a view from above the structure 200. The area exposed to the electron beam 280 that may correspond to an opening where the T-gate 110 may rest is shown by a smaller rectangle 310. An area exposed to the electron beam 280 that may correspond to an opening where a club extension may be formed is shown by one of four example shapes 320, 330, 340, 350.

Figure 3A:
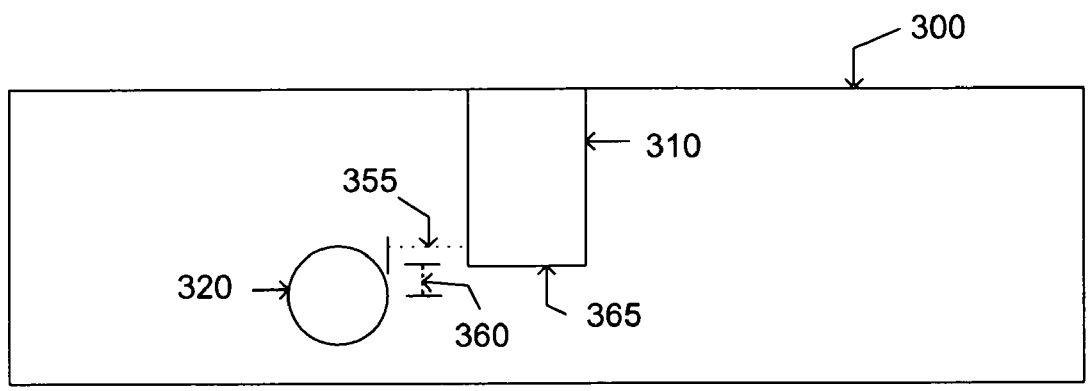
FIGS. 3a-d are overhead views of areas of bi-layer resists that are exposed to electron beam lithography in order to form T-gates with a club extension.

Turning to FIG. 3a, an approximately circular shape 320 illustrates the area exposed to the electron beam 280 that may correspond to an approximately circular shaped club extension. Although the shape 320 shown in FIG. 3 is a circle, shapes that are not perfectly circular may be exposed to form an area where an approximately circular club extension may reside. For example, the side of the example circular shape 320 may be jagged, irregular, or misshapen. A misshapen circular shape may approximate an oval or ellipse. The example shape 320 has an approximate diameter of 0.4 microns to 2 microns. There is a gap 355 between the approximately circular shape 320 and a side of the exposed area 310. The gap 355 may be approximately greater or equal to 0.1 microns. The approximately circular shape 320 may rest a distance 360 forward from a front 365 of the exposed area 310. The distance 360 may be approximately 0.3 to 0.5 microns from the center of the approximately circular shape 320.

Figure 3B:
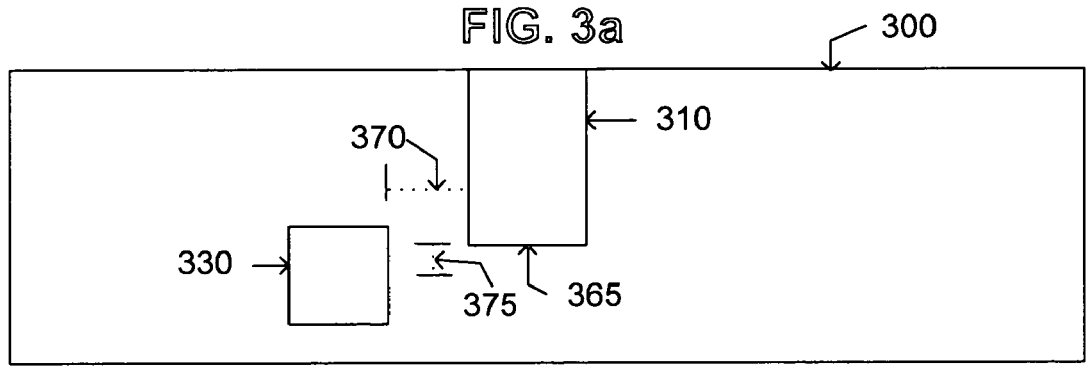

FIG. 3b illustrates an approximately square shape 330 exposed to the electron beam 280 that may correspond to an approximately square shaped club extension. Although the shape shown in FIG. 3b is a square, shapes that do not form a perfect square may be exposed to the electron beam 280 to form an area where an approximately square club extension may reside. For example, the sides of the approximately square shape 330 do not have to be of equal length. The angles that form the approximately square shape 330 do not have to be 90 degrees. Sides of the approximately square shape 330 may be irregular, curved or jagged. To form an approximately square club extension, a side of the approximately square shape 330 may be approximately 0.4 microns to approximately 2 microns long. There is a gap 370 between a side of the approximately square shape 330 and the exposed area 310. The gap 370 may be approximately 0.1 micron or more. The approximately square shape 330 may rest a distance 375 slightly forward from a front 365 of the exposed area 310. The distance 375 may be approximately 0.3 to 0.5 microns from the center of the approximate square shape 330.

Figure 3C:
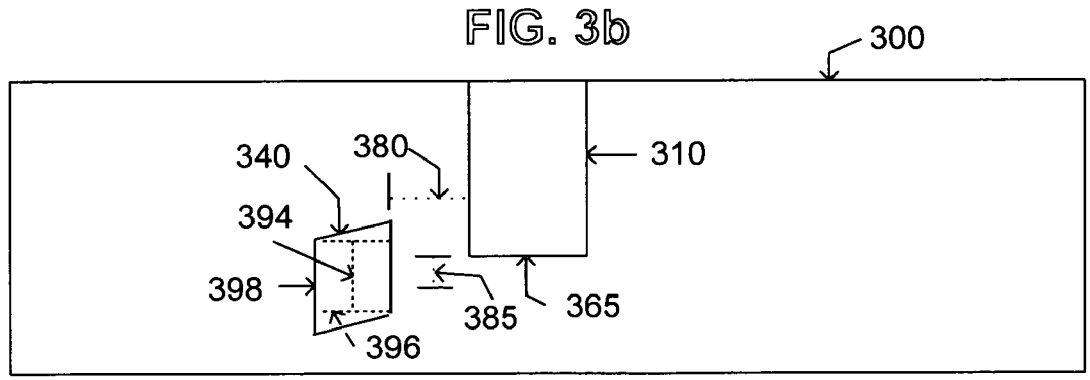

FIG. 3c illustrates an example approximately parallelogram shape 340 exposed to the electron beam 280 that may correspond to an approximately parallelogram shaped club extension. Although the area shown in FIG. 3c is a parallelogram, areas that do not form a perfect parallelogram may be exposed to form an area that may contain an approximate parallelogram shaped club extension. For example, the sides of the approximately parallelogram shape 340 may be curved or jagged. Furthermore, the opposite angles of the approximate parallelogram shape 340 may be incongruent or the opposite sides may be unparallel. A height 394 of the parallelogram shape 340 may be approximately 0.4 microns to 2 microns. A width 396 of the parallelogram shape 340 may be approximately 0.4 microns to approximately 2 microns. A longer side 398 of the shape 340 may be parallel to the exposed area 365. There is a gap 380 between a side of the parallelogram shape 340 and the exposed area 310. The gap 380 may be approximately equal to or greater than 0.1 micron. The approximate parallelogram 340 may rest a distance 385 slightly forward a front 365 of the exposed area 310. The distance 385 may be approximately 0.3 to 0.5 microns from the center of the approximate parallelogram 340.

Figure 3D:
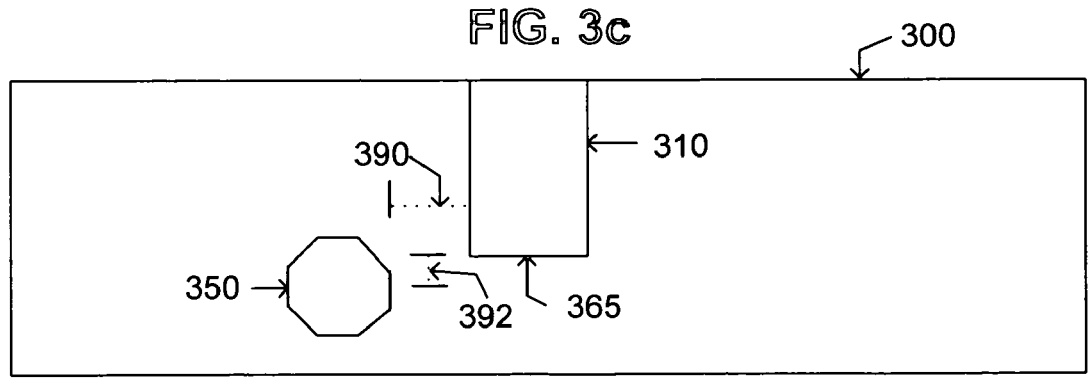

FIG. 3d illustrates an approximate polygon shape 350 exposed to the electron beam 280 that may correspond to an approximately polygon shaped club extension. Herein a polygon is a figure that has at least two sides that forms an enclosure. Although the area shown in FIG. 3d is a polygon, areas that do not form a perfect polygon may be exposed to EBL to form an area where an approximately polygon club extension may reside. For example, the sides of the polygon shape 350 may be curved or jagged. The approximate polygon shape 350 may have an approximate diameter of 0.4 microns to 2 microns. Although a polygon does not have a radius per se, an approximate radius of a polygon may be calculated by taking the average distance from an approximate center of the polygon to each vertex. Alternatively, an approximate radius of a polygon may be calculated by taking an average distance of a plurality of distances between an approximate center of the polygon and an edge of the polygon. Measuring a circumference of the polygon and dividing the circumference by twice pi may also provide an approximate radius of a polygon. There is a gap 390 between the approximate polygon shape 350 and exposed area 310. The gap may be approximately greater than or equal to 0.1 microns. The approximate polygon shape 350 may rest a distance 392 slightly forward from a front 365 of the exposed area 310. The distance may be approximately 0.3 to 0.5 microns from the center of the approximate polygon 350.

After the resist 210 is exposed to the electron beam 280, the resist 210 may be developed, or developed out. Developing the resist 210 may entail immersing the resist 210 in a solution comprised of a methyl isobutyl ketone or a combination of methyl isobutyl ketone and isopropanol. After immersion, resist 210 that was exposed to the electron beam 280 is developed out. Developing out the resist may entail removing parts of the resist that were exposed to the electron beam 280. The result is an opening in the resist where the T-gate 110 and the club extension may sit. The resist 210 may develop stress cracks in the process of electron beam 280 exposure and development. Developing an area of the resist 210 where a club extension may sit may alleviate stress cracks formed during electron beam 280 exposure and development.

The combination of the size of the area exposed and ebeam conditions on the ebeam 280 may affect the final three dimensional club shape obtained in the resist profile. By modifying the ebeam conditions on the ebeam 280 and the area exposed, some resist may remain 260 and the upper portion of the resist may be developed out 270. Modifying ebeam conditions on the ebeam 280 and area exposed may result in the development of the resist 270, 260 (or 210) to the substrate 220. For example, the type of ebeam conditions used on the ebeam 280 and the area exposed may result in exposure through the resist 210 to the substrate 220. The area of resist 210 exposed to ebeam 280 may be developed out to the substrate 220. On the other hand, if a different area of the resist 210 is exposed and the ebeam conditions is re-modified on the ebeam 280, the area of the resist exposed to the ebeam 280 may not be developed out fully to the substrate 220. In this case, there may be resist 220 remaining under the exposed area after the exposed area is developed out.

Figure 4A:
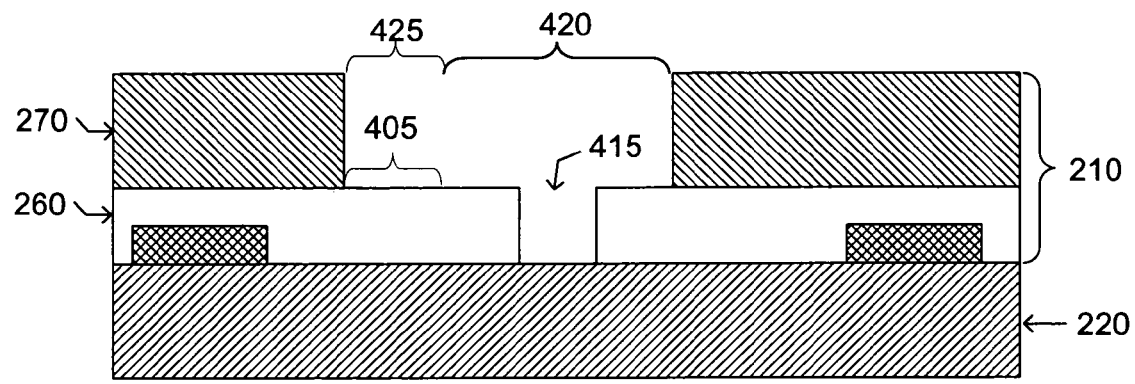
FIG. 4a and FIG. 4b are front views of bi-layer resists on substrates after electron beam lithography exposure and development.

An example of the developed resist 210 is illustrated in FIG. 4. FIG. 4a illustrates the bi-layer resist 210 developed such that a portion of the bi-layer resist 405 remains on the substrate 220 under the area of the resist 210 that was exposed to create a space for a club extension. After the resist 210 is developed, there is an opening where the T-gate stem may rest 415. There is also an area where the wings of the T-gate 420 and an area where the club extension may reside 425. In this particular case, a portion of the lower layer of the bi-layer resist 405 remains on the substrate 220 after the resist 210 is developed. In this example, the beam conditions of the ebeam 280 used on an exposed area results in the lower layer 260 of the bi-layer resist 210 remaining. In other examples, by using other types of electron beam conditions, the developed area may extend partly through the upper layer 270 of the resist 210. Alternatively, modifying electron beam conditions on the ebeam 280 may result in the upper layer 270 of the resist 210 being completely exposed and partly exposed through the lower layer 260 of the resist 210. The electron beam 280, depending on the conditions used, may expose the resist 210 anywhere between a portion of the top layer 270 of the bi-layer resist 210 to a depth through both layers 260, 270 of the resist 210 to the substrate 220.

Figure 4B:
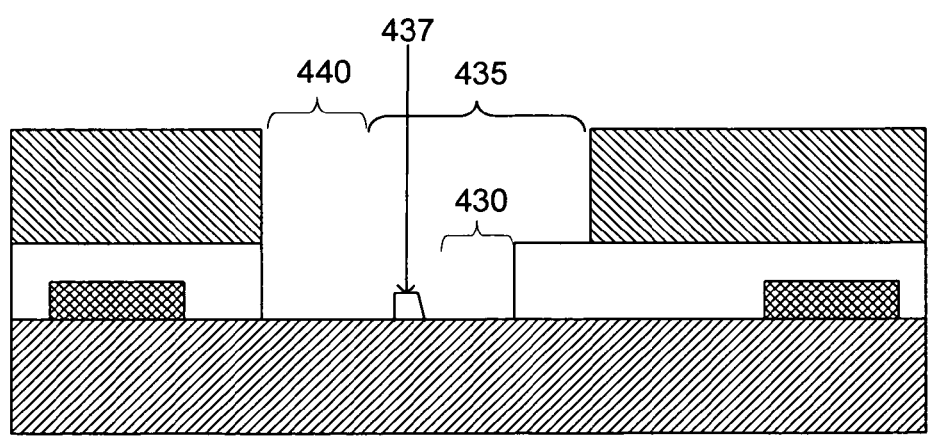

FIG. 4b illustrates the bi-layer resist 210 developed such that all the resist 210 is removed in the area where the club extension may reside 440. There is an area where the T-gate stem may reside 430. There is an area where the wings of the T-gate may reside 435. There is also an area where the club extension may reside 440. In this particular example, the exposed area corresponding to the club extension 440 may be large. The resist 210 is completely removed where the club extension may reside 440 depending on condition used on the ebeam 280. After the resist is developed, it is possible that small portions of resist 437 may remain between the space for the T-gate stem 430 and the location the club extension may reside 440.

After the resist 210 is developed, a T-gate and club extension may be formed using a metallization process. During the metallization process electrically conductive material such as gold, titanium, nickel or tantalum is used to form the T-gate and club extension. After the T-gate and club extension are formed, any resist 210 remaining on the substrate 220 is removed during a lift-off process. After the resist 210 has been lifted off, the T-gate and club extension may remain on the substrate 220.

Figure 5A:
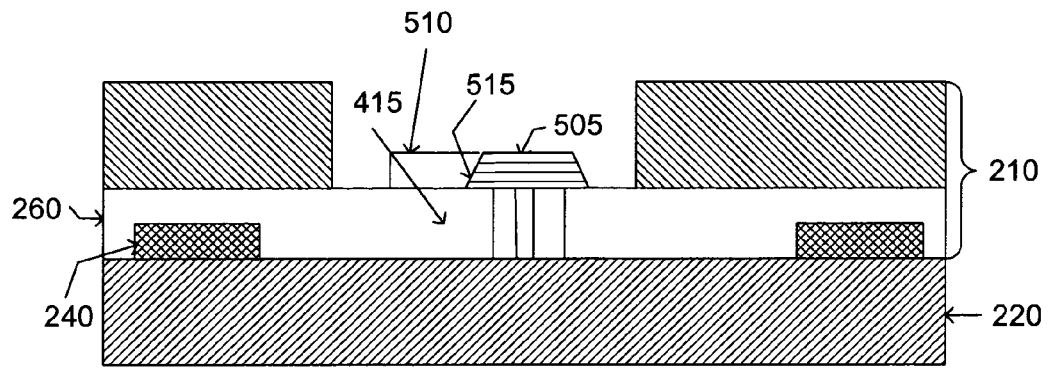
FIG. 5a and FIG. 5b are front views of T-gates and club extensions on substrates after metallization and before lift-off.

Turning to FIG. 5, a T-gate 505, 535 and club extension 510, 520 are shown after metallization and before lift-off. FIG. 5a, illustrates a club extension 510 that does not extend to the substrate 220. In this example, resist 415 remains under the club extension 510. The club extension 510 rests on the resist 210 on a side of the T-gate 505 nearest the source ohmic contact 240. The club extension 510 may be affixed to a T-gate wing 515.

Figure 5B:
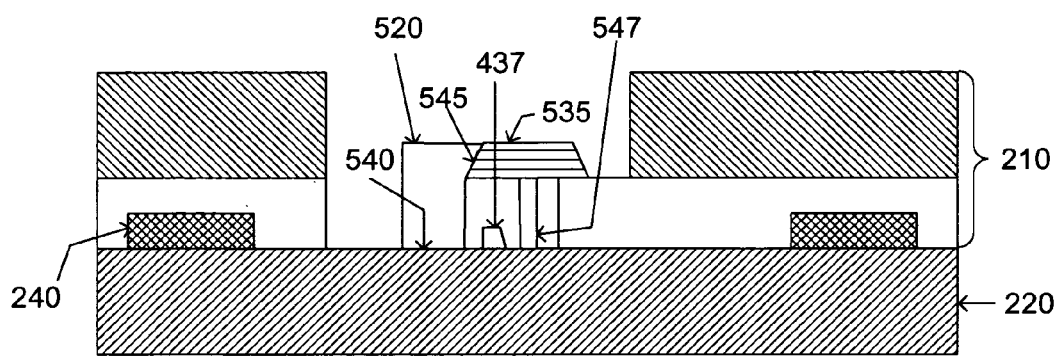

FIG. 5b illustrates a club extension 520 that extends to the substrate 220. In this example, the club extension 520 extends to the substrate 220. As discussed, a small portion of resist 437 may remain between a base 540 of the club extension and the stem of the T-gate 547. It is also possible that after development no resist 210 remains between the club extension 520 and the T-gate stem 537. The base of the club extension 540 may rest on the substrate 220 on a side of the T-gate 535 nearest the source ohmic contact 240. The club extension 520 may be affixed to the T-gate 535 at a T-gate wing 545.

Figure 6A:
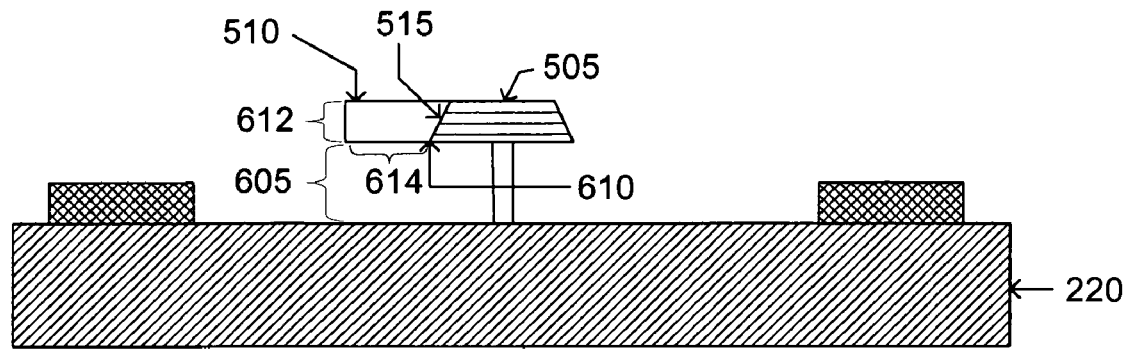
FIG. 6a and FIG. 6b are front views of T-gates and club extensions after metallization and lift-off.

Turning to FIG. 6 that illustrates the T-gates 505, 535 and club extensions 510, 520 of FIG. 5 after the resist 210 has been lifted off. In FIG. 6a the club extension 510 is affixed to the wing 515 of the T-gate 505. There may be a space 605 between a bottom 610 of the club extension 510 and the substrate 220. The size of the space 605 between the bottom 610 of the club extension 510 and the substrate 220 may vary depending on the results of electron beam 280 exposure. In other words, the depth 612 of the club 510 may vary depending on the results of electron beam 280 exposure. The club 510 also extends a distance 614 from the T-gate 505. The distance 614 may vary depending on the results of electron beam 280 exposure.

Figure 6B:
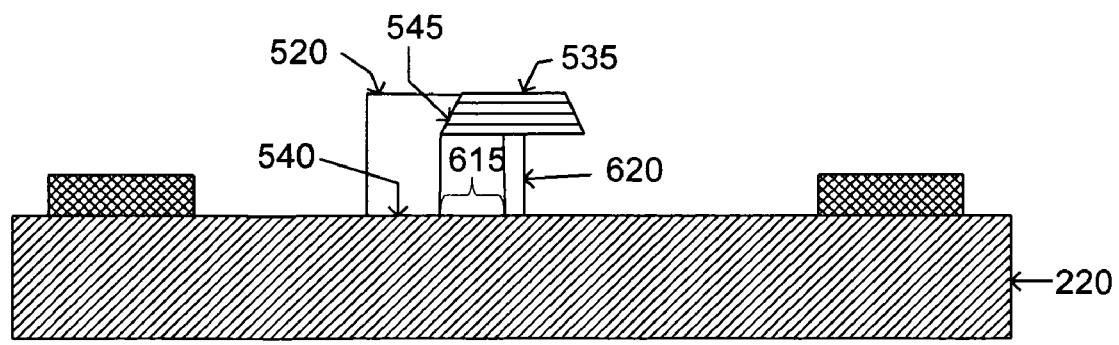
Figure 7A:
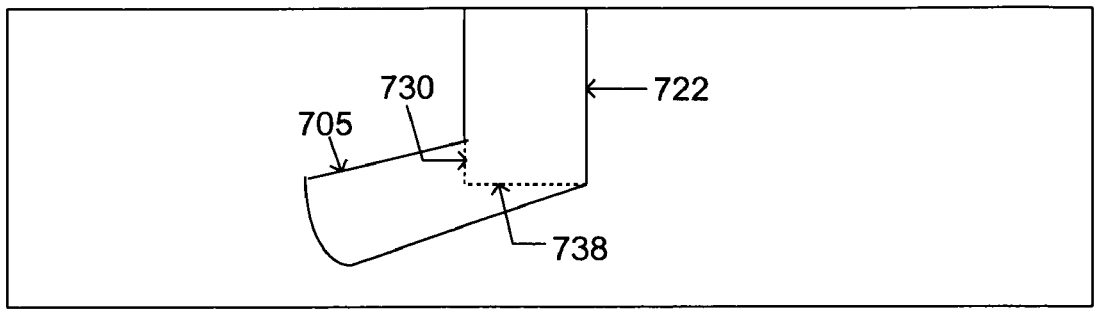
FIGS. 7a-d are overhead views of T-gates with a club extension after lift-off.
Figure 7B:
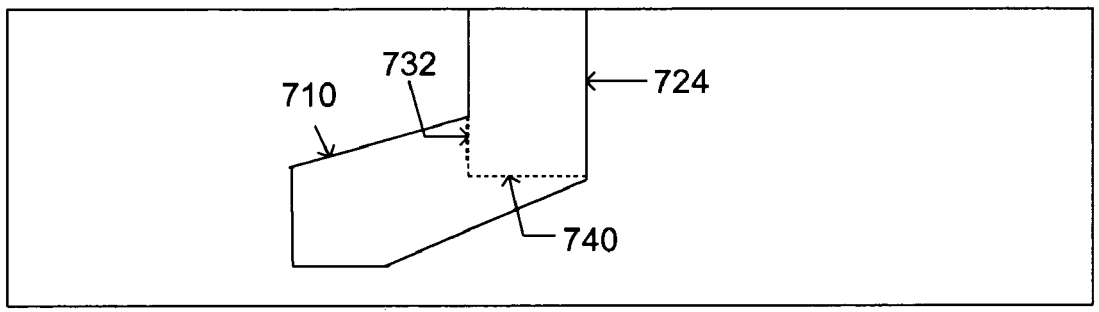
Figure 7C:
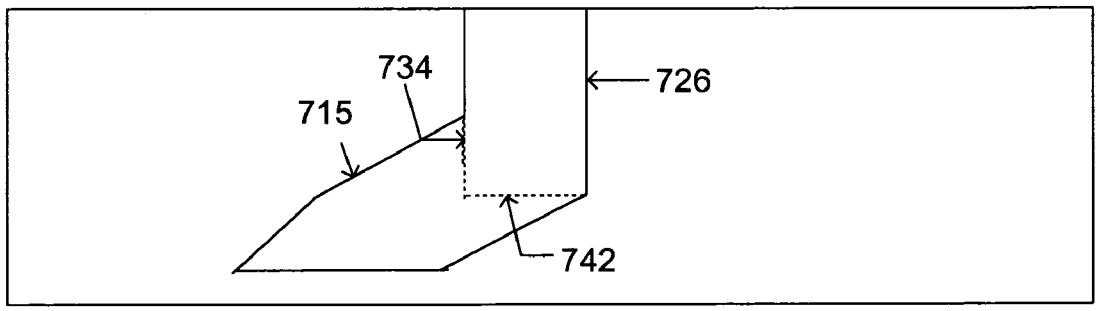
Figure 7D:
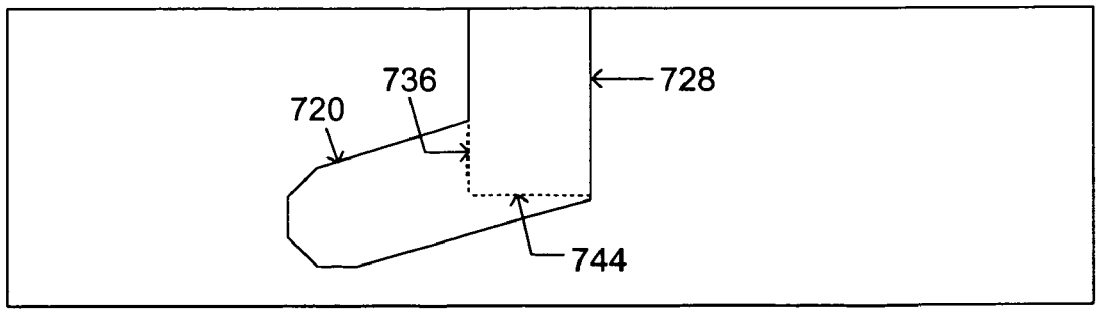

FIG. 6b is an illustration of the T-gate 535 and club extension 520 of FIG. 5b after the resist 220 has been lifted off. The base 540 of the club extension 520 is affixed to the substrate 220. The club extension 520 is also affixed to a wing 545 of the T-gate 535. There may be a gap 615 between the base 540 of the club extension 520 and the stem 620 of the T-gate 535. The size of the gap 615 may vary depending on the results of electron beam 280 exposure.

Turning to FIG. 7 that is an overhead view of club extensions 705, 710, 715, 720 and T-gates 722, 724, 726, 728 after development and lift off. The club extensions 705, 710, 715, 720 and T-gates 722, 724, 726, 728 illustrated in FIG. 7 correlate to the example shapes depicted in FIG. 3. Thus FIG. 7a is an example illustration of a club extension 705 that may be created from the exposed shape 320 as shown in FIG. 3a. FIG. 7b is an example illustration of a club extension 710 that may be created from the exposed shape 330 as shown in FIG. 3b. FIG. 7c is an example illustration of a club extension 715 that may be created from the exposed shape 340 as shown in FIG. 3b. FIG. 7d is an example illustration of a club extension 720 that may be created from the exposed shape 350 as shown in FIG. 3d.

Depending on conditions used during electron beam exposure, the example club extensions 705, 710, 715, 720 shown in FIG. 7 may be larger than the shape 320, 330, 340, 350 exposed to create the club extension 705, 710, 715, 720. The club extensions 705, 710, 715, 720 depicted in FIG. 7 are affixed to the T-gate 722, 724, 726, 728. The club extensions 705, 710, 715, 720 may be affixed to a side 730, 732, 734, 736 of the T-gate 722, 724, 726, 728 as well as a front 738, 740, 742, 744 of the T-gate 722, 724, 726, 728. Although the edges extending from the club extension 705, 710, 715, 720 to the T-gate 722, 724, 726, 728 are depicted using straight lines, in practice the edges that extend from the club extension 705, 710, 715, 720 to the T-gate 722, 724, 726, 728 may be jagged, curved, or some other non-linear shape.

The present method and apparatus are not limited to the particular details of the depicted embodiments and other modifications and applications are contemplated. Certain other changes may be made in the above-described embodiments without departing from the true spirit and scope of the present method and apparatus herein involved. It is intended, therefore, that the subject matter in the above depiction shall be interpreted as illustrative and not in a limiting sense.

What is claimed is:

1. A system comprising:
   a T-gate high electron mobility transistor (HEMT);
   a club extension positioned on an ohmic source side of a proximate front of the T-gate HEMT and approximately 0.03 to 0.5 microns forward from a front of the T-gate HEMT; and
   wherein the club extension is metallically affixed to the T-gate HEMT and the T-gate HEMT is affixed to a substrate.

2. The system of claim 1 wherein the substrate is one of GaN, Sapphire, SiN, SiC, and a III V substrate.

3. The system of claim 1 wherein the club extends to the substrate.

4. The system of claim 3 wherein the club approximates a circle with an approximate diameter of 0.4 to 2 microns.

5. The system of claim 3 wherein the club approximates a square wherein:
   a length of a side of the approximate square is approximately 0.4 to 2 microns; and
   at least one side of the approximate square is substantially parallel to a wing of the T-gate HEMT.

6. The system of claim 3 wherein the club approximates a parallelogram wherein:
   a height of the approximate parallelogram is approximately 0.4 to 2 microns;
   a width of the approximate parallelogram is approximately 0.4 to 2 microns; and
   a longer side of the approximate parallelogram is parallel to a wing of the T-gate HEMT.

7. The system of claim 3 wherein the club approximates a polygon wherein a diameter of the approximate polygon is approximately 0.4 to 2 microns.

8. The system of claim 1 wherein the club does not extend to the substrate.

9. The system of claim 8 wherein the club approximates a circle wherein the approximately circular club has an approximate diameter of 0.4 to 2 microns.

10. The system of claim 8 wherein the club approximates a square wherein:
    a length of a side of the approximately square is approximately 0.4 to 2 microns; and
    at least one side of the approximately square club is parallel to a wing of the T-gate HEMT.

11. The system of claim 8 wherein the club approximates a parallelogram wherein:
    a height of the approximate parallelogram is approximately 0.4 to 2 microns;
    a width of the approximate parallelogram is approximately 0.4 to 2 microns; and
    the longer side of the approximate parallelogram is parallel to a wing of the T-gate HEMT.

12. The system of claim 8 wherein the club approximates a polygon wherein:
    a diameter of the approximate polygon is approximately 0.4 to 2 microns.

* * * * *